US012709539B2

(12) United States Patent
Partanen et al.

(10) Patent No.: US 12,709,539 B2
(45) Date of Patent: Aug. 18, 2026

(54) METHOD FOR BONDING A MICROELECTROMECHANICAL DEVICE

(71) Applicant: Murata Manufacturing Co., Ltd., Nagaokakyo (JP)

(72) Inventors: Mikko Partanen, Vantaa (FI); Petteri Kilpinen, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 381 days.

(21) Appl. No.: 18/513,787

(22) Filed: Nov. 20, 2023

(65) Prior Publication Data

US 2024/0166499 A1 May 23, 2024

(30) Foreign Application Priority Data

Nov. 22, 2022 (EP) .................................... 22208689

(51) Int. Cl.
*B81C 1/00* (2006.01)
*B81B 7/00* (2006.01)

(52) U.S. Cl.
CPC ........ *B81C 1/00269* (2013.01); *B81B 7/0032* (2013.01); *B81B 7/0035* (2013.01); *B81B 7/0041* (2013.01); *B81B 2201/0235* (2013.01); *B81B 2201/0242* (2013.01); *B81C 1/00261* (2013.01); *B81C 1/00277* (2013.01); *B81C 1/00293* (2013.01); *B81C 2203/01* (2013.01); *B81C 2203/0118* (2013.01); *B81C 2203/031* (2013.01)

(58) Field of Classification Search
CPC ............ B81C 1/00269; B81C 1/00277; B81C 1/00293; B81C 1/00261; B81C 1/00285; B81C 2203/01; B81C 2203/0118; B81C 2203/0145; B81C 2203/019; B81C 2203/031; B81C 2203/033; B81C 2203/038; B81C 2203/0109; B81C 2203/05–058; B81B 7/0035; B81B 7/0041; B81B 7/0032; B81B 7/0038; B81B 2201/0235; B81B 2201/0242; H10W 80/102; H10W 80/341
See application file for complete search history.

(56) References Cited

U.S. PATENT DOCUMENTS 7,659,150 B1 * 2/2010 Monadgemi .......... H10W 76/60 257/E23.193
2015/0232326 A1 * 8/2015 Chang ................. B81C 1/00269 438/51
2016/0130137 A1 * 5/2016 Huang ................ B81C 1/00285 438/51
2017/0167945 A1 * 6/2017 Coronato ................ G01P 15/18
2021/0147218 A1 5/2021 Flader
2022/0041432 A1 * 2/2022 Classen ................. B81C 1/0023

* cited by examiner

*Primary Examiner* — Julio J Maldonado
*Assistant Examiner* — Nathan Pridemore
(74) *Attorney, Agent, or Firm* — ArentFox Schiff LLP

(57) ABSTRACT

A method is provided for bonding microelectromechanical components with at least two different pressure element cavities. The method includes forming on the cap wafer or/and on the structure wafer a metal layer that allows the hermetically sealing of one cavity at a first pressure, then hermetically scaling the other cavity at a second pressure.

20 Claims, 10 Drawing Sheets

METHOD FOR BONDING A MICROELECTROMECHANICAL DEVICE

CROSS REFERENCE TO RELATED APPLICATIONS

This application claims priority to European Application No. 22208689.4, filed Nov. 22, 2022, the entire contents of which are hereby incorporated by reference.

TECHNICAL FIELD

This disclosure relates to electronic devices and, more particularly, to microelectromechanical device components. The present disclosure further concerns bonding of microelectromechanical device components with a plurality of element cavities.

BACKGROUND

Electronic chips, also called dies, are prepared by manufacturing various electronic structures on a substrate and cutting the substrate into small, chip-size pieces. These chips may be microelectromechanical systems (MEMS) devices formed from a silicon wafer by etching and coating techniques. MEMS devices usually combine mechanical and electrical parts. They can have either simple or complex structures with various moving parts. MEMS devices, which are also called elements, include different types of sensors such as accelerometers, gyroscopes, or magnetometers.

It is costly to manufacture each die separately. Additionally, a large surface area is required in a component when each MEMS element is built on a separate die. Significant cost and area reduction can be made when several MEMS elements are built on the same die. Once the MEMS elements are built, they need to be sealed in a surrounding gas. This poses a challenge for building multiple elements on the same die, considering that a gas atmosphere which is ideal for the functioning of one element may not be ideal for another element which is intended to be included in the same die. For example, it is important to surround an accelerometer by relatively high gas pressure which reduces excessive movement and therefore damage caused by external shocks, whereas a gyroscope requires the surrounding gas pressure to be close to vacuum in order to operate accurately.

Wafer bonding is a semiconductor bonding technology that creates mechanically robust hermetic seals. Anodic bonding is a wafer bonding process that involves joining a semiconductor with glass or ceramics through an electric field. Usually, glass with high concentration of alkali ions, such as borosilicate glass is used. When silicon and glass are in contact in the presence of an electric field, chemical reactions take place at the interface resulting in the oxidation of the silicon surface. This leads to bonding between the glass and the silicon wafer. Anodic bonding is widely used for sealing MEMS dies with cap wafers that comprise glass. However, it can be challenging to anodically bond a cap wafer to a die comprising two or more cavities that need to be sealed at different gas pressures, or in different surrounding gases.

SUMMARY OF THE INVENTION

Accordingly, the present disclosure provides a solution to the problem described above in which anodic bonding of microelectromechanical components comprising more than one microelectromechanical element where the microelectromechanical elements are sealed at different pressures or in different surrounding gases.

In particular, according to an exemplary aspect, a method is provided for manufacturing a microelectromechanical component that includes a structure wafer and a cap wafer that defines a horizontal xy-plane and a vertical z-direction that is perpendicular to the xy-plane, the cap wafer including a top surface, a bottom surface that includes glass regions, a first cap wafer sealing region and a second cap wafer sealing region that includes at least one of the glass regions, and the structure wafer includes top and bottom surfaces, and a first cavity and a second cavity, with a first microelectromechanical device structure in the first cavity and a second microelectromechanical device structure in the second cavity, the structure wafer further including a first structure wafer sealing region that surrounds the first cavity and a second structure wafer sealing region that surrounds the first cavity and the second cavity. In this aspect, the method includes forming a metal layer on at least one of the bottom surface of the cap wafer in the first cap wafer sealing region and the top surface of the structure wafer in the first structure wafer sealing region; placing the cap wafer on top of the structure wafer so that the first cap wafer sealing region is aligned with the first structure wafer sealing region along the z-axis, and the second cap wafer sealing region is aligned with the second structure wafer sealing region along the z-axis; fixing the cap wafer to the structure wafer in a surrounding first gas atmosphere so that the metal layer and the cap wafer form a hermetically sealing enclosure around outer edges of the first cavity; changing the surrounding first gas atmosphere to a surrounding second gas atmosphere; and anodically bonding the second cap wafer sealing region to the second structure wafer sealing region in the surrounding second gas atmosphere so that the second cavity is hermetically sealed.

In another exemplary aspect, a microelectromechanical component is provided that includes a cap wafer that defines a horizontal xy-plane and a vertical z-direction that is perpendicular to the xy-plane, the cap wafer including a top surface, a bottom surface that includes glass regions, a first cap wafer sealing region and a second cap wafer sealing region that includes at least one of the glass regions; a structure wafer including top and bottom surfaces, a first cavity, a second cavity, a first structure wafer sealing region that surrounds the first cavity, and a second structure wafer sealing region that surrounds the first cavity and the second cavity; a first microelectromechanical device structure in the first cavity; a second microelectromechanical device structure in the second cavity; and a metal layer on at least one of the bottom surface of the cap wafer in the first cap wafer sealing region and the top surface of the structure wafer in the first structure wafer sealing region. In this aspect, the first cap wafer sealing region is aligned with the first structure wafer sealing region along the z-axis, and the second cap wafer sealing region is aligned with the second structure wafer sealing region along the z-axis, wherein the metal layer and the cap wafer form a hermetically sealing enclosure around outer edges of the first cavity, and the second cap wafer sealing region is anodically bonded to the second structure wafer sealing region so that the second cavity is hermetically sealed at a different pressure than the first cavity.

The exemplary aspects of the disclosure are based on the idea of a multiple-stage bonding process where distinct regions of a microelectromechanical component comprising at least two element cavities are bonded to a cap wafer. This is achieved by forming a metal layer on the cap wafer, or/and on the microelectromechanical component wafer, then hermetically sealing the first cavity in a surrounding first gas atmosphere at a first pressure by pressing the cap wafer against the microelectromechanical component wafer at a temperature allowing the metal layer to soften or melt. The second cavity is subsequently hermetically sealed in a surrounding second gas atmosphere at a second pressure by anodically bonding the cap wafer to the microelectromechanical component wafer. This method allows the anodic bonding of monolithic microelectromechanical components with different pressure elements.

BRIEF DESCRIPTION OF THE DRAWINGS

In the following, the disclosure will be described in greater detail by exemplary embodiments with reference to the accompanying drawings, in which.

DETAILED DESCRIPTION

Figure 1:
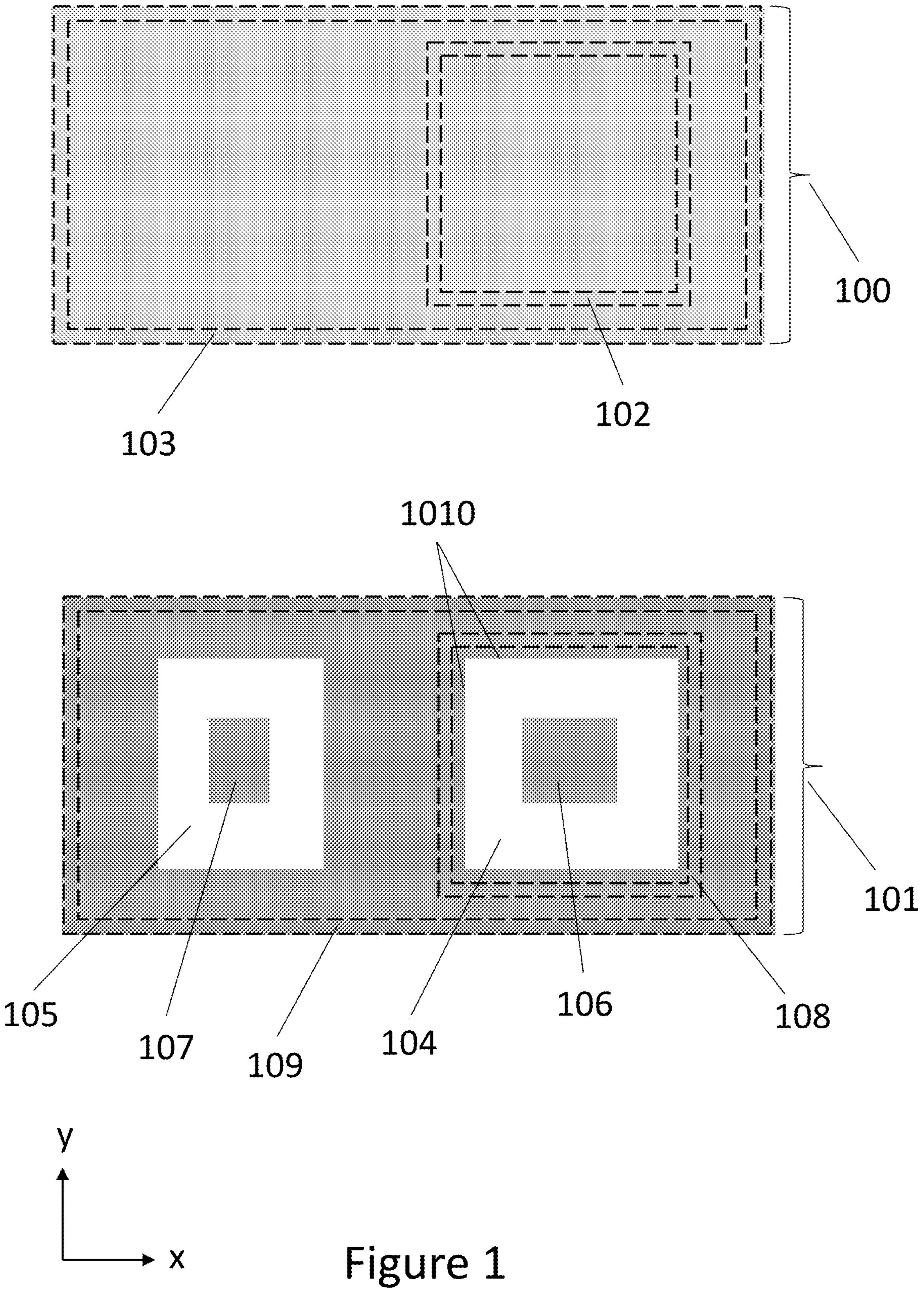
FIG. 1 illustrates a bottom view of a cap wafer and a top view of a structure wafer comprising two cavities according to an exemplary aspect.

The disclosure describes a method for manufacturing a microelectromechanical component. According to an exemplary aspect, the microelectromechanical component comprises a cap wafer and a structure wafer, and the cap wafer defines a horizontal xy-plane and a vertical z-direction which is perpendicular to the xy-plane. The cap wafer has a top surface and a bottom surface, and the bottom surface comprises glass regions. The cap wafer further comprises a first cap wafer sealing region and a second cap wafer sealing region and the second cap wafer sealing region comprises at least one of the glass regions. The structure wafer has a top surface and a bottom surface, and the structure wafer comprises a first cavity and a second cavity, and a first microelectromechanical device structure in the first cavity and a second microelectromechanical device structure in the second cavity. The structure wafer further comprises a first structure wafer sealing region and a second structure wafer sealing region wherein the first cavity and the second cavity are surrounded by the second structure wafer sealing region, and the first cavity is surrounded by the first structure wafer sealing region.

According to an exemplary aspect, the method includes forming a metal layer on at least one of the bottom surface of the cap wafer in the first cap wafer sealing region, and on the top surface of the structure wafer in the first structure wafer sealing region, placing the cap wafer on top of the structure wafer so that the first cap wafer sealing region is aligned with the first structure wafer sealing region along the z-axis, and the second cap wafer sealing region is aligned with the second structure wafer sealing region along the z-axis, fixing the cap wafer to the structure wafer in a surrounding first gas atmosphere so that the metal layer and the cap wafer form a hermetically sealing enclosure around the outer edges of the first cavity, changing the surrounding first gas atmosphere to a surrounding second gas atmosphere, and anodically bonding the second cap wafer sealing region to the second structure wafer sealing region in the surrounding second gas atmosphere so that the second cavity is hermetically sealed.

According to an exemplary aspect, the structure wafer may be a semiconductor device layer that has been attached to a support layer. The device layer may be a layer of silicon. The device layer and the support layer may for example be parts of a silicon-on-insulator (SOI) substrate where MEMS elements can be formed by patterning the top silicon layer (i.e., the device layer). The cap wafer may be a glass layer, or a wafer comprising semiconductor regions and glass regions wherein the glass regions may be located on the bottom surface of the cap wafer, or on the bottom surface of the cap wafer and between the semiconductor regions. The semiconductor regions may be silicon regions. The glass may be but is not limited to borosilicate glass.

For purposes of this disclosure any direction or plane that is parallel to the xy-plane defined by the cap wafer can be considered or called "horizontal". The direction that is perpendicular to the xy-plane can be considered or called the "vertical" direction. Expressions such as "top", "bottom", "above", "below", "up" and "down" refer in this disclosure to differences in the vertical z-coordinate. It should be appreciated that these expressions do not imply anything about how the device should be oriented with respect to the Earth's gravitational field when the component is in use or when it is being manufactured.

FIG. 1 illustrates an example of a bottom view of a cap wafer 100 and a top view of a structure wafer 101 according to an exemplary aspect. As shown the cap wafer includes a first cap wafer sealing region 102 and a second cap wafer sealing region 103. The second cap wafer sealing region 103 surrounds the first cap wafer sealing region 102. The structure wafer 101 comprises a first cavity 104, a second cavity 105, a first microelectromechanical device structure 106 in the first cavity 104 and a second microelectromechanical device structure 107 in the second cavity 105. The structure wafer 101 further comprises a first structure wafer sealing region 108 that surrounds the outer edges 1010 of the first cavity 104 and a second structure wafer sealing region 109. The second structure wafer sealing region 109 surrounds the first cavity 104 and the second cavity 105. In an exemplary aspect, the first structure wafer sealing region 108 and the first cap wafer sealing region 102 can be made at least partly congruent and aligned with each other along the z-axis when the cap wafer 100 is placed on top of the structure wafer 101.

Figure 2A:
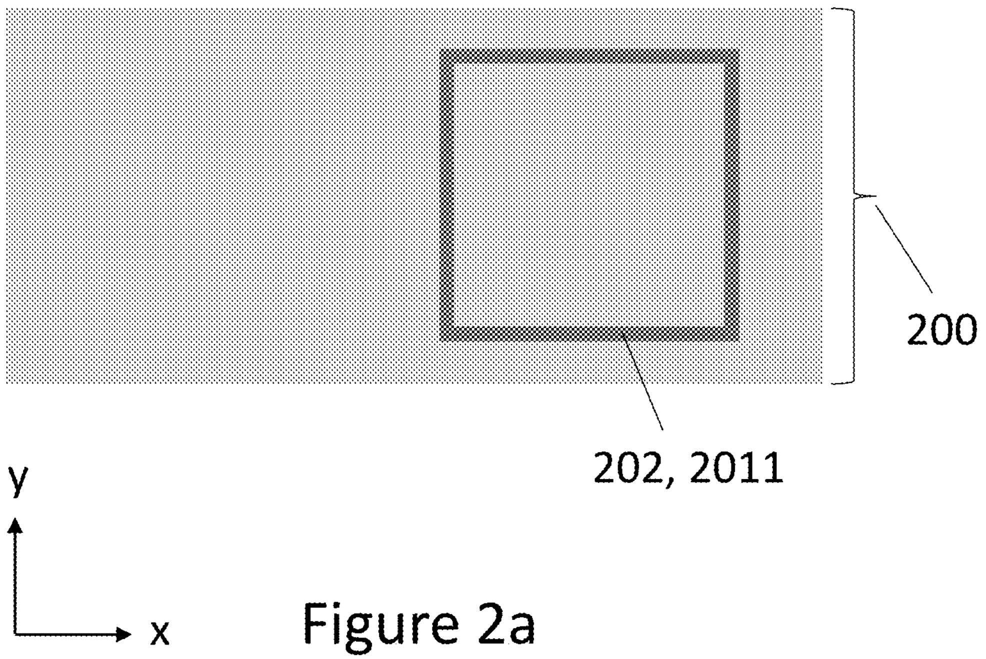
FIGS. 2*a*-2*d* illustrate steps of a method for bonding a cap wafer to a structure wafer in a microelectromechanical component with at least two cavities according to an exemplary aspect.

FIGS. 2*a*-2*d* illustrate exemplary steps of the method for bonding a cap wafer to a structure wafer in a microelectromechanical component with at least two cavities that need be sealed at different pressures. FIG. 2*a* illustrates the stage of the method where a metal layer 2011 is formed for example on the bottom surface of the cap wafer 200 in the first cap wafer sealing region 202. The metal layer may be made of a variety of metals that include but are not limited to Al, Cu, Ag, Au, Pt, Pd, Mo or metal alloys. In an exemplary aspect, the metal layer may be formed by a variety of deposition methods such as sputtering, chemical vapor deposition, molecular beam epitaxy, electron beam physical vapor evaporation, or laser metal deposition. It is noted that these exemplary features and options can apply to all embodiments in this disclosure. Reference numbers 200 and 202 in FIG. 2*a* correspond to reference numbers 100 and 102, respectively, in FIG. 1.

Figure 2B:
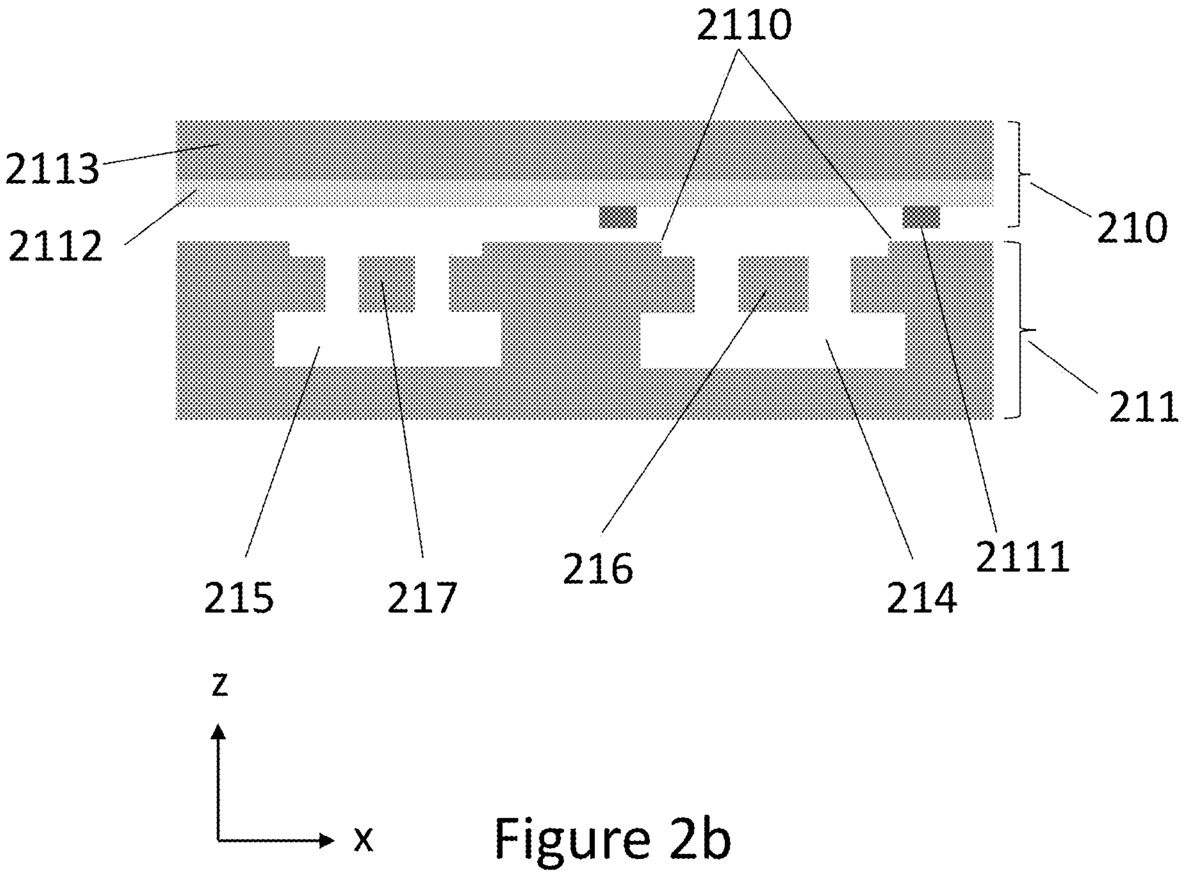

FIG. 2*b* illustrates the stage of the method where the cap wafer is placed on top of a structure wafer so that the first cap wafer sealing region is aligned with the first structure sealing region along the z-axis, and the second cap wafer sealing region is aligned with the second structure wafer sealing region along the z-axis. The cap wafer 210 comprises the metal layer 2111 that was formed on the bottom surface of the glass region 2112. The cap wafer 210 may further comprise a semiconductor region 2113 on top of the glass region 2112. The semiconductor region may be a silicon region. The structure wafer 211 comprises a first cavity 214, a second cavity 215, a first microelectromechanical device structure 216 located in the first cavity 214 and a second microelectromechanical device structure 217 located in the second cavity 215. When the cap wafer 210 is fixed to the structure wafer 211, the metal layer 2111 surrounds the outer edges 2110 of the first cavity 214. Reference numbers 210, 211, 214, 215, 216, and 217 in FIG. 2*b* correspond to reference numbers 100, 101, 104, 105, 106, and 107, respectively, in FIG. 1.

Figure 2C:
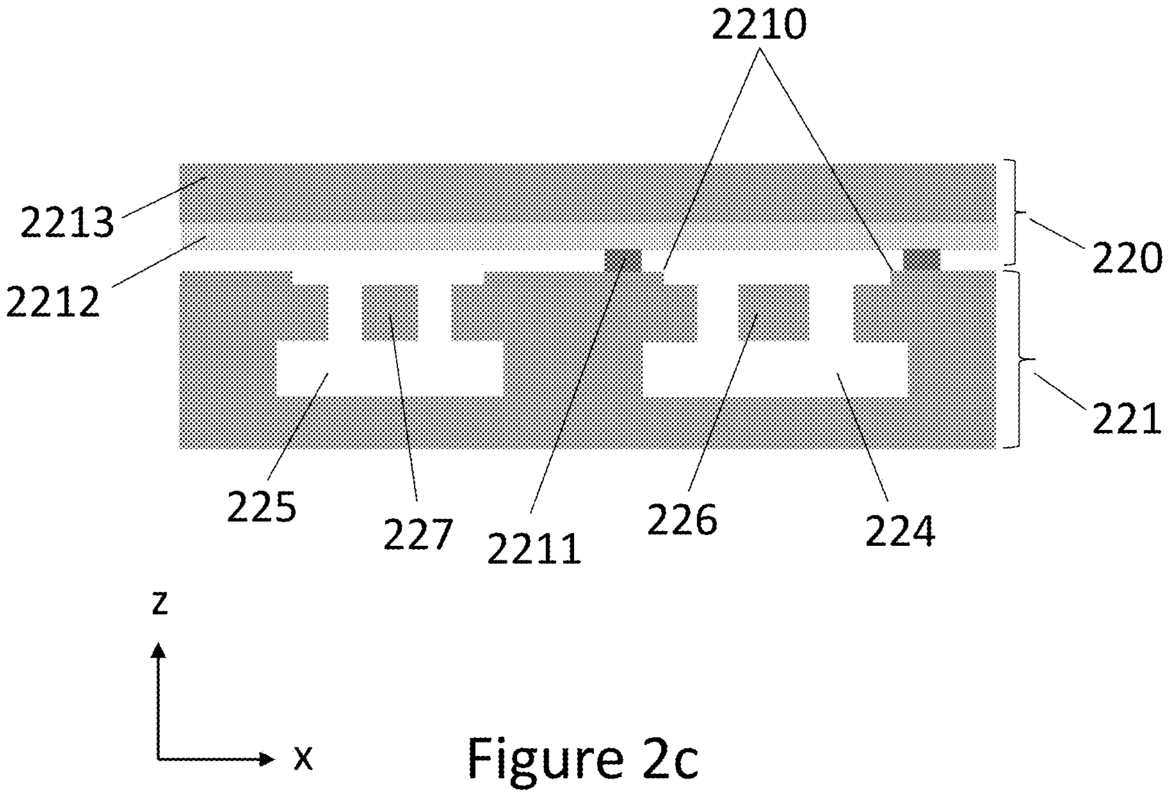

FIG. 2*c* illustrates a further stage of the method where the cap wafer 220 is fixed to the structure wafer 221 in a surrounding first gas atmosphere so that the metal layer 2211 that is attached to the bottom surface of the cap wafer and the cap wafer form a hermetically sealing enclosure around the outer edges 2210 of the first cavity 224. When the cap wafer 220 is fixed to the structure wafer 221, the metal layer 2211 surrounds the outer edges 2210 of the first cavity 224. The cap wafer 220 is then pressed against the structure wafer 221 at a temperature allowing the metal layer to soften or melt. Subsequently, the metal layer 2211 may immerse into the semiconductor/glass interface and the first cavity is hermetically closed. According to an exemplary aspect, the temperature may be in the range [200-500] ° C., or [250-450] ° C., or [300-400] ° C. when this process is carried out. There are different mechanisms that may create a hermetic seal around the first cavity. For example, solid diffusion between the metal and the semiconductor, or a mere mechanical pressure that creates a seal tight enough for gas pressure change. When the metal layer is soft enough at room temperature, such as the case of Al, higher temperatures may not be needed. It is noted that these features and options can again apply to all exemplary embodiments in this disclosure. After hermetically sealing the first cavity in the surrounding first gas atmosphere, the surrounding first gas atmosphere is changed to a surrounding second gas atmosphere. Reference numbers 220, 221, 224, 225, 226, 227, 2210, 2211, 2212 and 2213 in FIG. 2*c* correspond to reference numbers 210, 211, 214, 215, 216, 217, 2110, 2111, 2112 and 2113, respectively, in FIG. 2*b*.

Figure 2D:
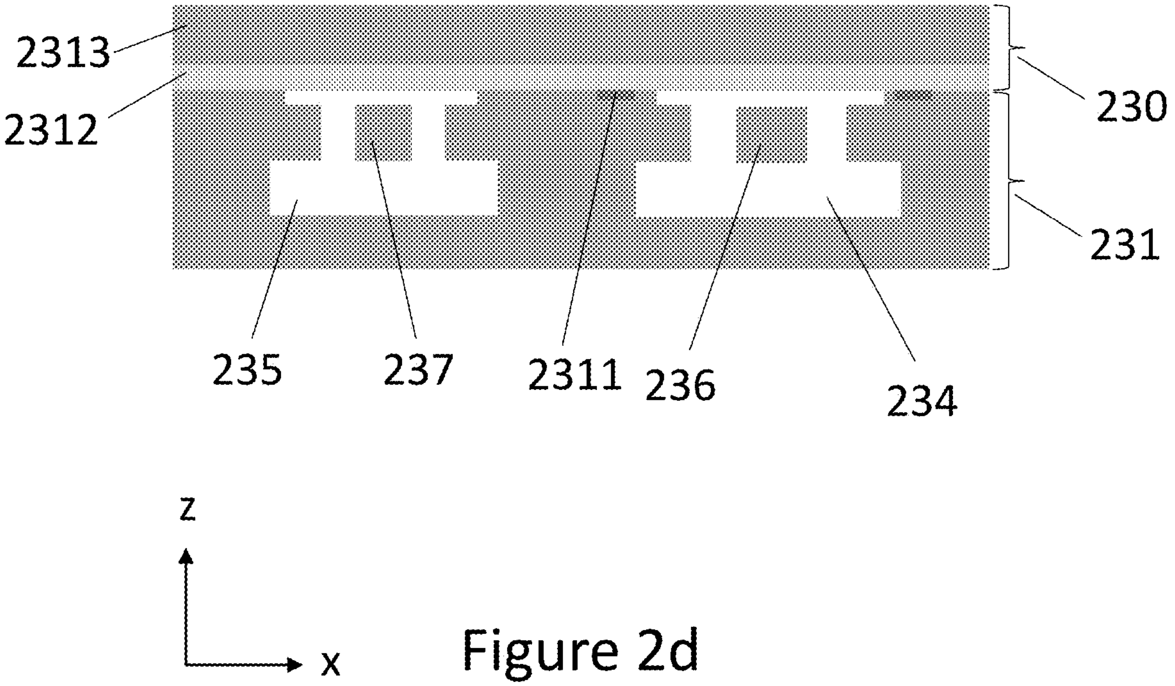

FIG. 2*d* illustrates the stage of the method where the second cap wafer sealing region is anodically bonded the second structure wafer sealing region in a surrounding second gas atmosphere. The pressure of the surrounding first gas atmosphere may be different from the pressure of the surrounding second gas atmosphere. The cap wafer 230 is pressed against the structure wafer 231 in the presence of an electric field. According to exemplary aspects, the applied voltage may be in the range [50-100] V, or [100-200] V, or [100-250] V, or [150-200] V or [150-300] V, which enables the anodic bonding of the second cap wafer sealing region to the second structure wafer sealing region. It is noted that these features or options can apply to all exemplary embodiments in this disclosure. The anodic bonding of the cap wafer to the structure wafer in the second surrounding gas atmosphere seals the second cavity at the second gas pressure. Reference numbers 230, 231, 234, 235, 236, 237, 2311, 2312 and 2313 in FIG. 2*d* correspond to reference numbers 210, 211, 214, 215, 216, 217, 2111, 2112 and 2113, respectively, in FIG. 2*b*.

The metal layer may be formed on the bottom surface of the cap wafer. Alternatively, or complementarily, it may be formed on the top surface of the structure wafer.

Figure 3A:
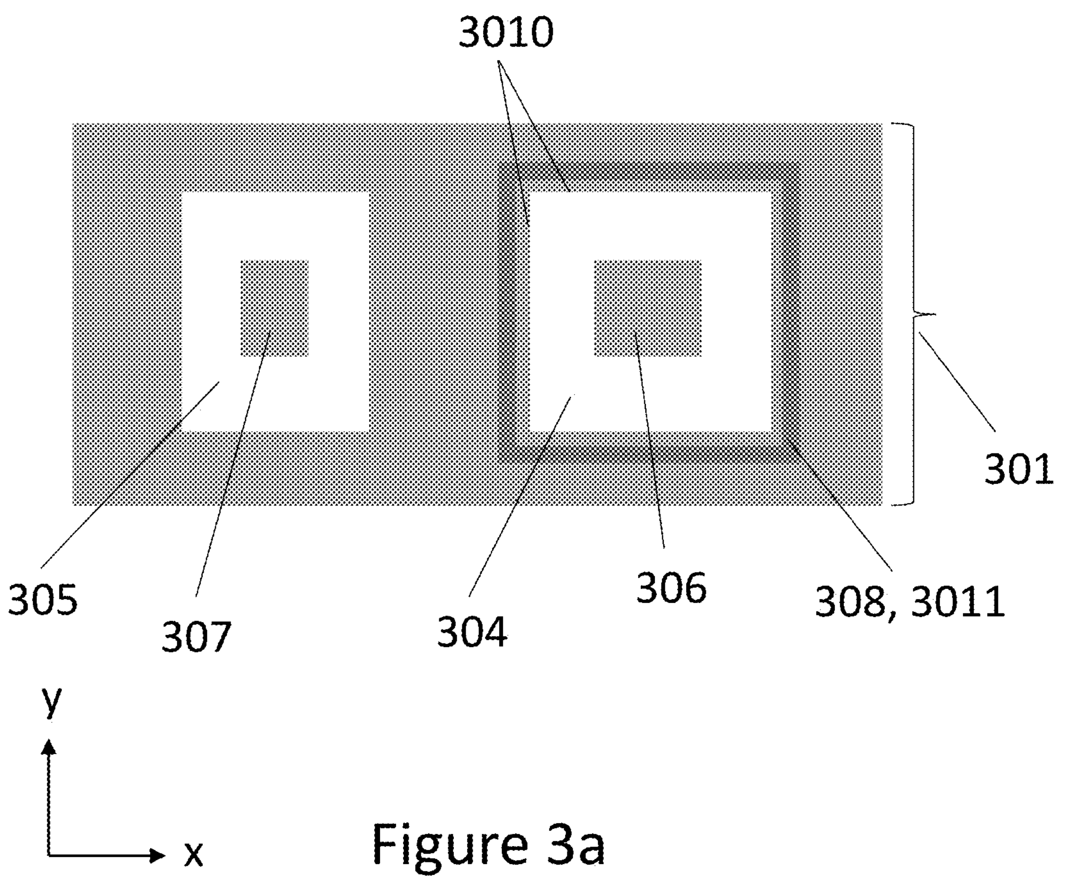
FIGS. 3*a*-3*b* illustrate an exemplary arrangement of the metal layer in a microelectromechanical component, wherein the metal layer is on the top surface of the structure wafer according to an exemplary aspect.
Figure 3B:
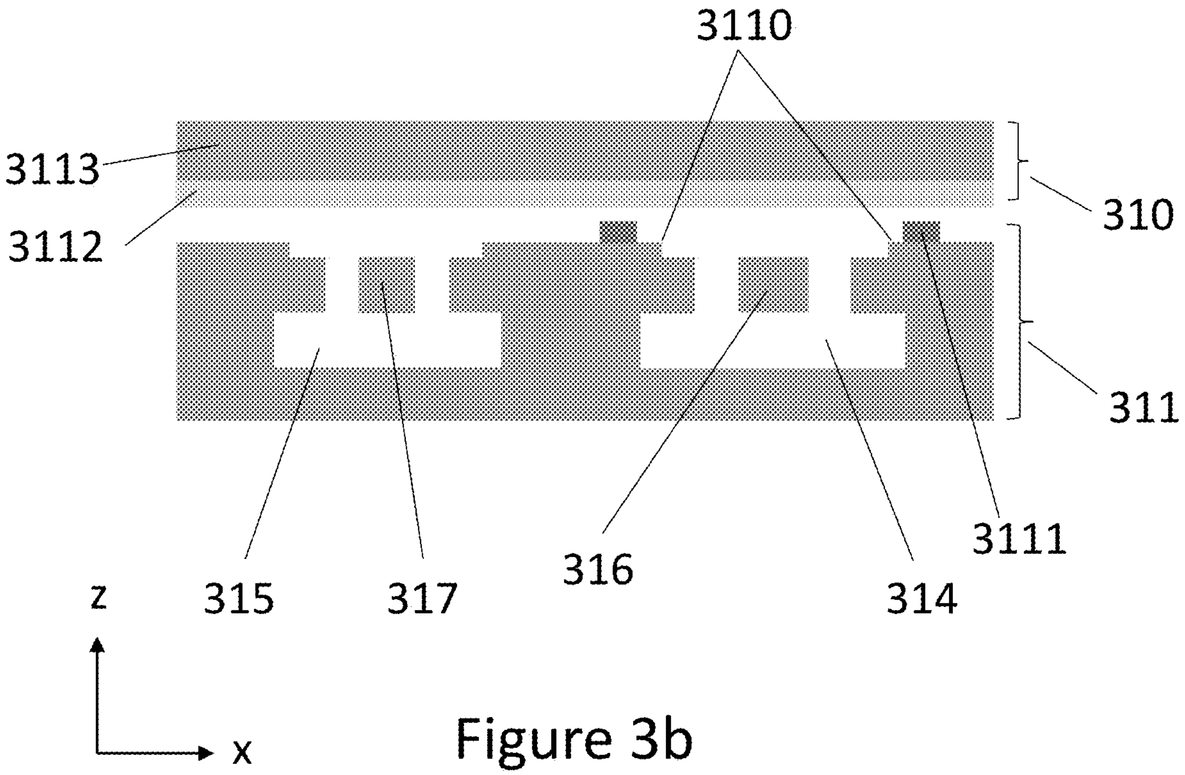

FIGS. 3*a*-3*b* illustrate an exemplary embodiment in which the metal layer is formed on the top surface of the structure wafer in the first structure wafer sealing region. FIG. 3*a* illustrates a top view of the structure wafer 301 that comprises a metal layer 3011 formed in the first structure wafer sealing region 308. The metal layer 3011 surrounds the outer edges 3010 of the first cavity 304. Reference numbers 301, 304, 305, 306, 307, 308, and 3010 in FIG. 3*a* correspond to 101, 104, 105, 106, 107, 108, and 1010, respectively, in FIG. 1.

FIG. 3*b* illustrates the stage of the method where a cap wafer 310 is placed on top of the structure wafer 311 so that the first cap wafer sealing region is aligned with the first structure sealing region along the z-axis, and the second cap wafer sealing region is aligned with the second structure wafer sealing region along the z-axis. The metal layer 3111 is on the top surface of the structure wafer 311 and surrounds the outer edges 3110 of the first cavity 314. When the cap wafer 310 is pressed against the structure wafer 311 at a temperature allowing the metal layer 3111 to soften or melt, the metal layer 3111 may immerse into the semiconductor/glass interface and the first cavity 314 is hermetically sealed. Reference numbers 310, 311, 314, 315, 316, 317, 3110, 3111, 3112 and 3113 in FIG. 3*b* correspond to 210, 211, 214, 215, 216, 217, 2110, 2111, 2112 and 2113, respectively, in FIG. 2*b*.

Figure 4A:
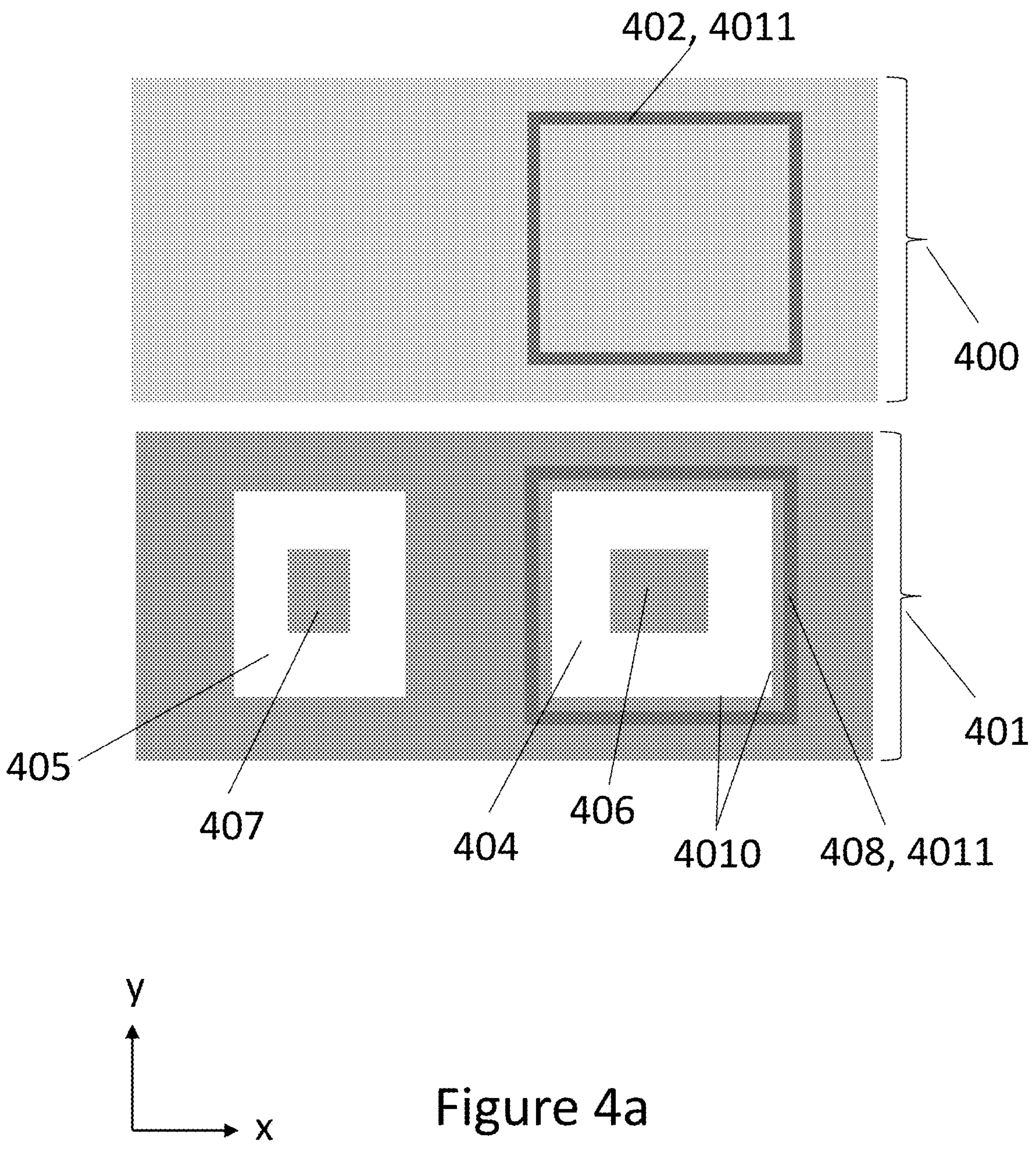
FIGS. 4*a*-4*b* illustrate an exemplary arrangement of the metal layer in a microelectromechanical component, wherein the metal layer is on the bottom surface of the cap wafer and on the top surface of the structure wafer according to an exemplary aspect.
Figure 4B:
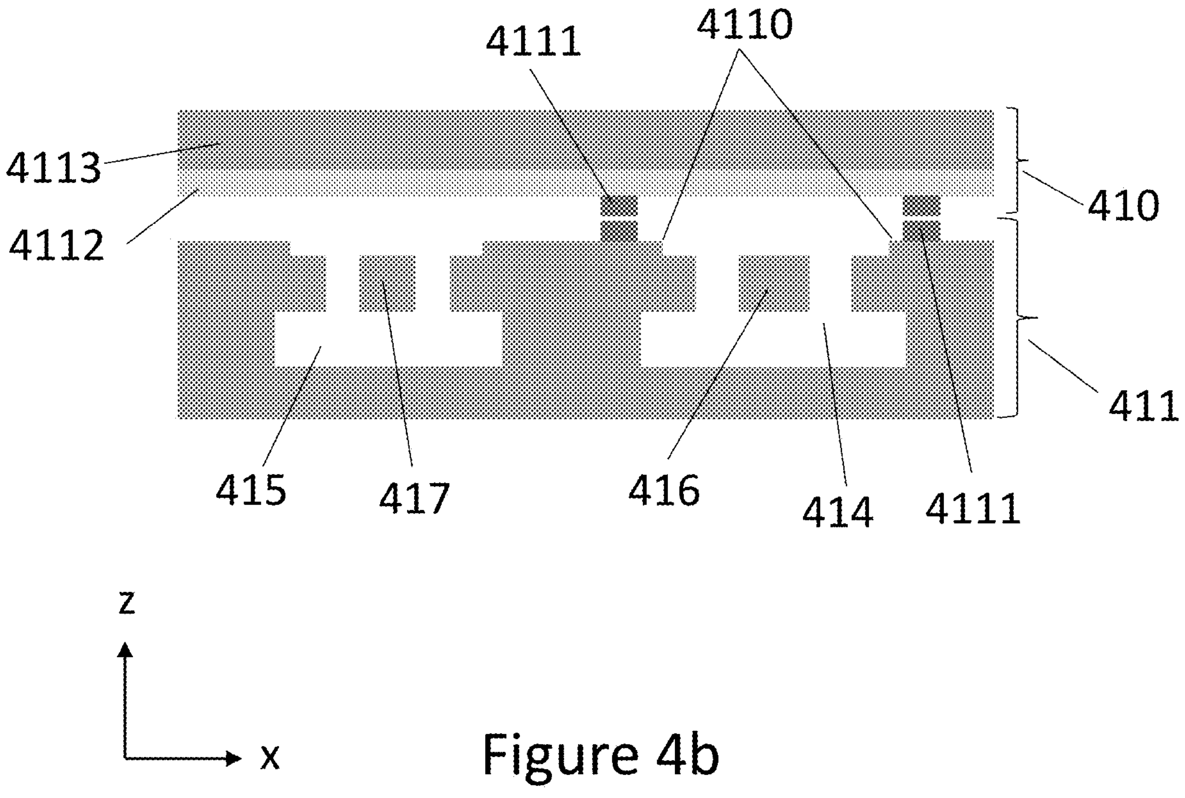

FIGS. 4*a*-4*b* illustrate an exemplary embodiment in which the metal layer is formed on the bottom surface of the cap wafer and on the top surface of the structure wafer. FIG. 4*a* illustrates a bottom view of the cap wafer 400 and a top view of the structure wafer 401, wherein the metal layer 4011 is formed in both the first cap wafer sealing region 402 and the first structure wafer sealing region 408. As shown, the metal layer 4011 that is formed on the top surface of the structure wafer surrounds the outer edges 4010 of the first cavity 404. Reference numbers 400, 401, 402, 404, 405, 406, 407, 408, and 4010, in FIG. 4*a* correspond to 100, 101, 102, 104, 105, 106, 107, 108, and 1010, respectively, in FIG. 1.

FIG. 4*b* illustrates the stage of the method where the cap wafer 410 is placed on top of a structure wafer 411 so that the first cap wafer sealing region is aligned with the first structure sealing region along the z-axis, and the second cap wafer sealing region is aligned with the second structure wafer sealing region along the z-axis. The metal layer 4111 is formed on the bottom surface of the cap wafer 410 and on the top surface of the structure wafer 411. When the cap wafer 410 is pressed against the structure wafer 411 at a temperature allowing the metal layer 4111 to soften or melt, the metal layer 4111 on the cap wafer 410 merges with the metal layer 4111 on the structure wafer 411. Consequently, the first cavity 414 is hermetically sealed in the surrounding first gas atmosphere. Reference numbers 410, 411, 414, 415, 416, 417, 4110, 4111, 4112 and 4113 in FIG. 4*b* correspond to 310, 311, 314, 315, 316, 317, 3110, 3111, 3112 and 3113, respectively, in FIG. 3*b*.

Figure 5A:
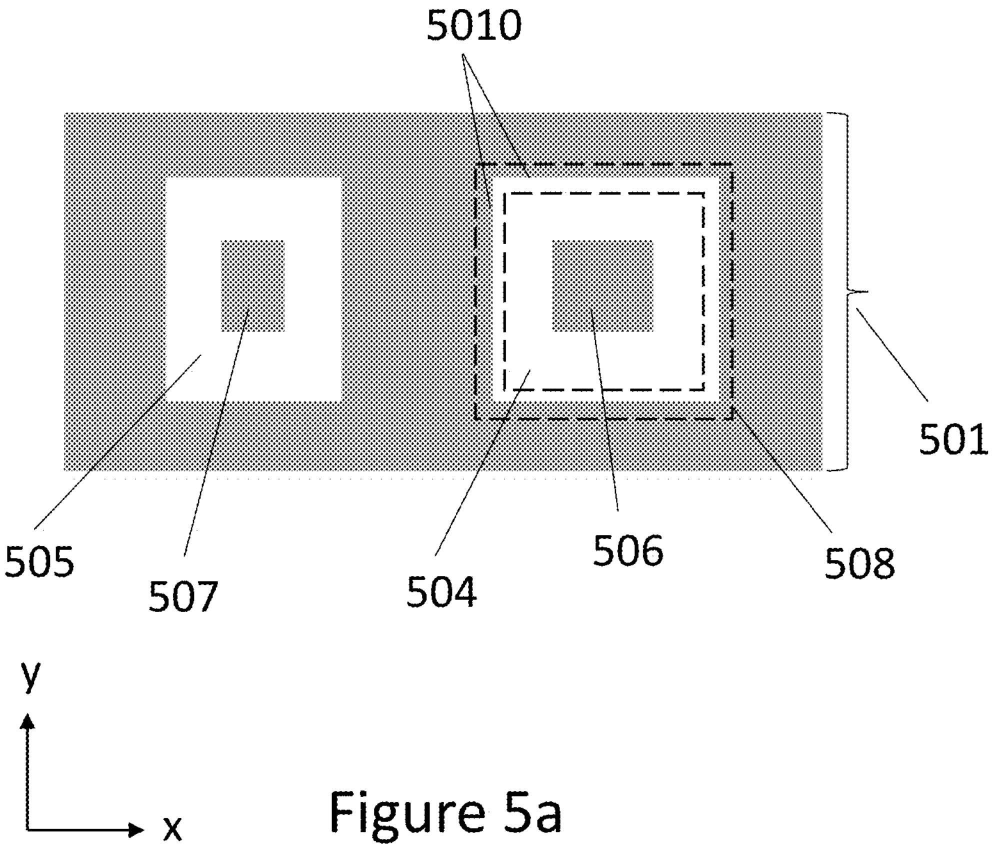
FIGS. 5*a*-5*b* illustrate an exemplary arrangement of the metal layer in a microelectromechanical component, wherein the inner edges of the metal layer extend beyond the outer edges of the first cavity according to an exemplary aspect.
Figure 5B:
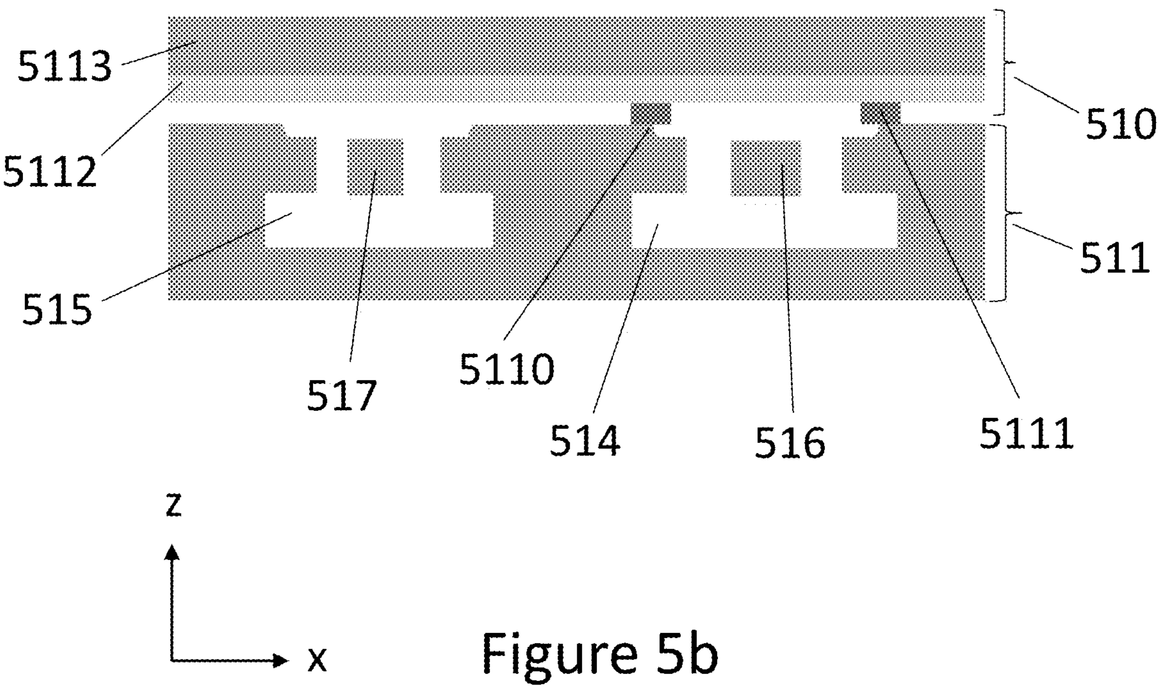

When the cap wafer is fixed to the structure wafer, the metal layer surrounds the outer edges of the first cavity. In an additional exemplary aspect, the inner edges of the metal layer may surround the outer edges of the first cavity. Alternatively, the inner edges of the metal layer may extend beyond the outer edges of the first cavity. It is noted that these features and options may apply to all exemplary embodiments in this disclosure. FIGS. 5*a*-5*b* illustrate an example of such embodiment. FIG. 5*a* illustrates a top view of the structure wafer 501. The inner edges of the first structure wafer sealing region 508 extend beyond the outer edges 5010 of the first cavity 504. Reference numbers 501, 504, 505, 506, 507, 508, and 5010 in FIG. 5*a* correspond to reference numbers 101, 104, 105, 106, 107, 108, and 1010, respectively, in FIG. 1.

FIG. 5*b* illustrates a side view of the microelectromechanical component where the cap wafer 510 is fixed to the structure wafer 511. The metal layer 5111 surrounds the outer edges 5110 of the first cavity 514, and the inner edges of the metal layer extend beyond the outer edges 5110 of the first cavity 514. Reference numbers 510, 511, 514, 515, 516, 517, 5110, 5111, 5112 and 5113 in FIG. 5*b* correspond to reference numbers 210, 211, 214, 215, 216, 217, 2110, 2111, 2112 and 2113, respectively, in FIG. 2*b*.

Figure 6A:
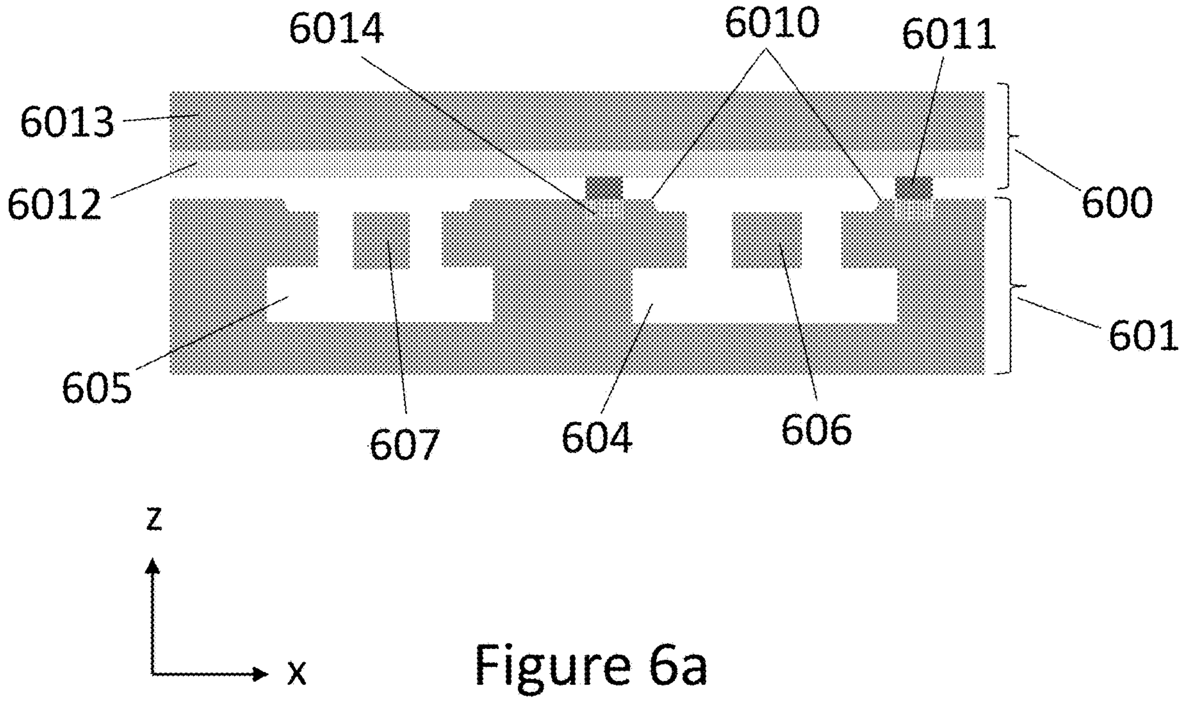
FIGS. 6*a*-6*b* illustrate steps for bonding a cap wafer to a structure wafer which comprises trenches according to an exemplary aspect.
Figure 6B:
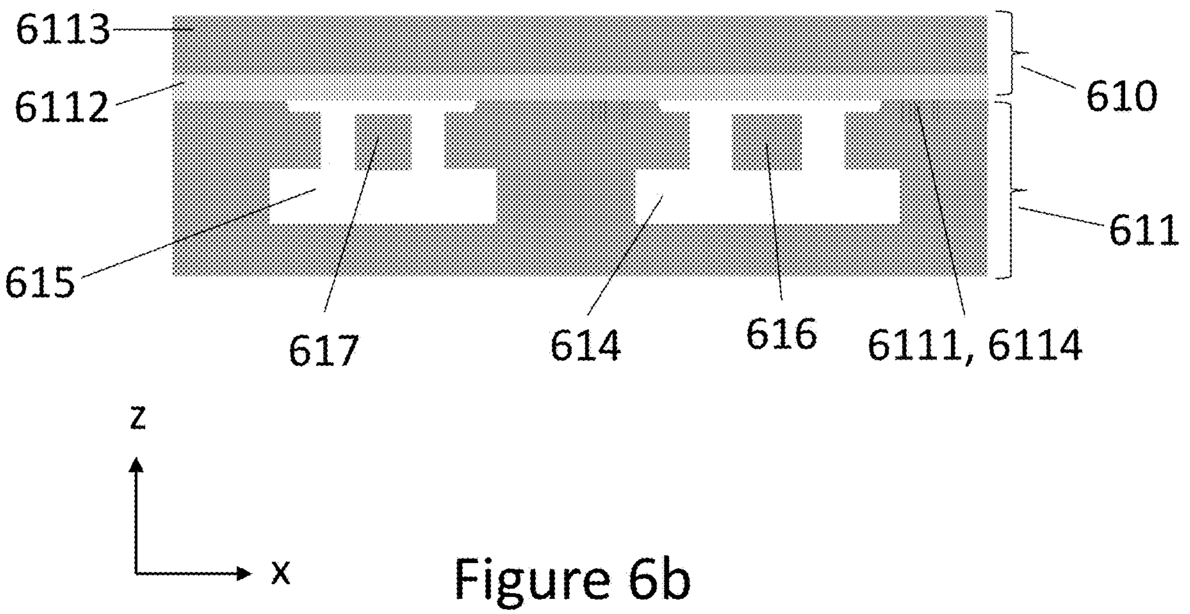

When the metal layer is formed on the bottom surface of the cap wafer, the structure wafer may comprise trenches in the first structure wafer sealing region. Alternatively, when the metal layer is formed on the top surface of the structure wafer, the cap wafer may comprise trenches in the first cap wafer sealing region. The trenches are long narrow channels that can extend along the z-axis in the first structure wafer sealing region or in the first cap wafer sealing region. It is noted that the exemplary trenches may be implemented in any exemplary embodiment in this disclosure. FIGS. 6*a*-6*b* illustrate an example of a microelectromechanical component comprising such vertical trenches.

FIG. 6*a* illustrates an example of a microelectromechanical component with a cap wafer 600 fixed to a structure wafer 601 so that the first cap wafer sealing region is aligned with the first structure sealing region along the z-axis, and the second cap wafer sealing region is aligned with the second structure wafer sealing region along the z-axis. The cap wafer 600 comprises a metal layer 6011 formed on the bottom surface of the glass region 6012. The cap wafer 600 may further comprise a semiconductor region 6013 on top of the glass region 6012. The structure wafer 601 comprises a first cavity 604, a second cavity 605, a first microelectromechanical device structure 606 located in the first cavity 604 and a second microelectromechanical device structure 607 located in the second cavity 605. The structure wafer further comprises vertical trenches 6014 that extend in the first structure wafer sealing region, so that they surround the outer edges 6010 of the first cavity 604. Reference numbers 600, 601, 604, 605, 606, 607, 6010, 6011, 6012 and 6013 in FIG. 6*a* correspond to reference numbers 210, 211, 214, 215, 216, 217, 2110, 2111, 2112 and 2113, respectively, in FIG. 2*b*.

FIG. 6*b* illustrates the microelectromechanical component shown in FIG. 6*a* with the cap wafer 610 anodically bonded to the structure wafer 611. When the cap wafer 610 is pressed against the structure wafer 611 at a temperature allowing the metal layer 6111 to soften or melt, the metal layer 6111 immerses into the trenches 6114 so that the first cavity is hermetically closed. The diffusion of the metal into the trenches may result in a more robust sealing of the first cavity. Reference numbers 610, 611, 614, 615, 616, 617, 6111, 6112, 6113 and 6114 in FIG. 6*b* correspond to reference numbers 600, 601, 604, 605, 606, 607, 6011, 6012, 6013 and 6014, respectively, in FIG. 6*a*.

Figure 7A:
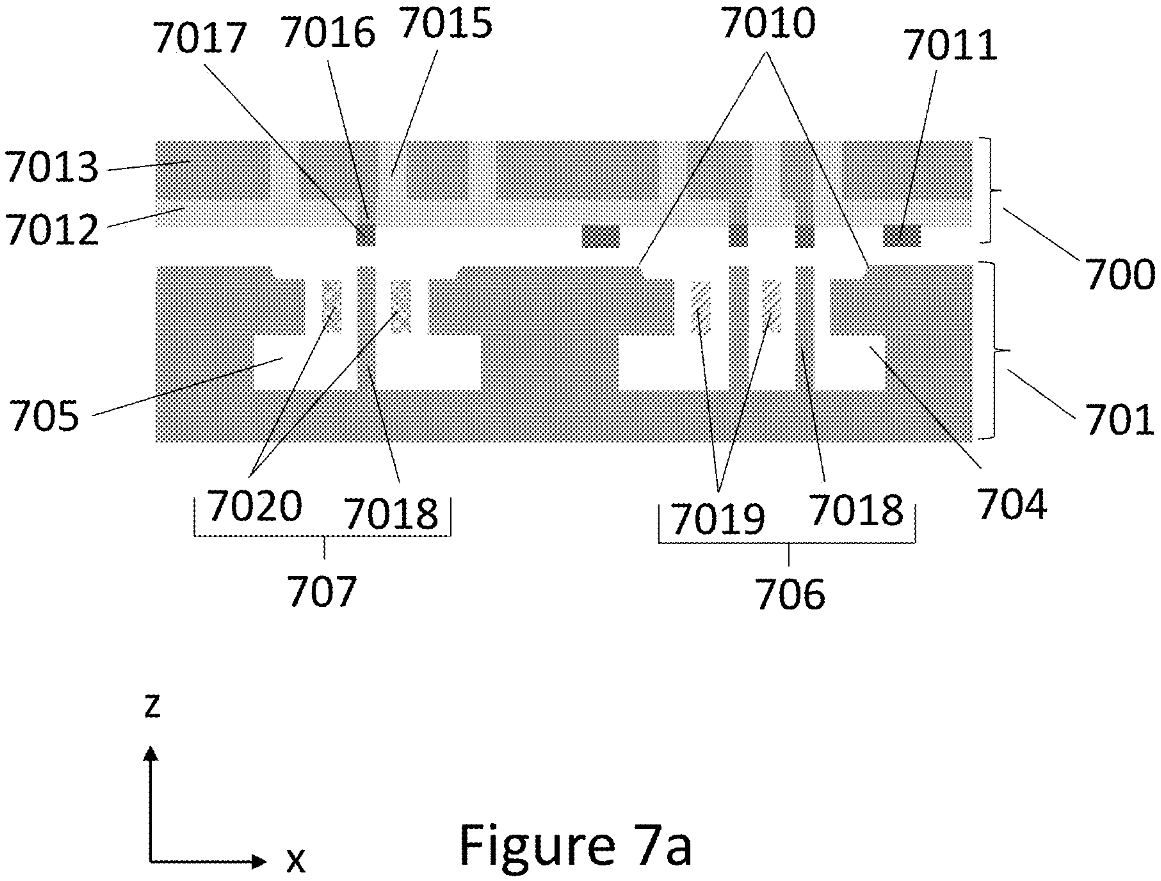
FIGS. 7*a*-7*b* illustrate a microelectromechanical component comprising a gyroscope and an acceleration sensor before and after anodic bonding according to an exemplary aspect.
Figure 7B:
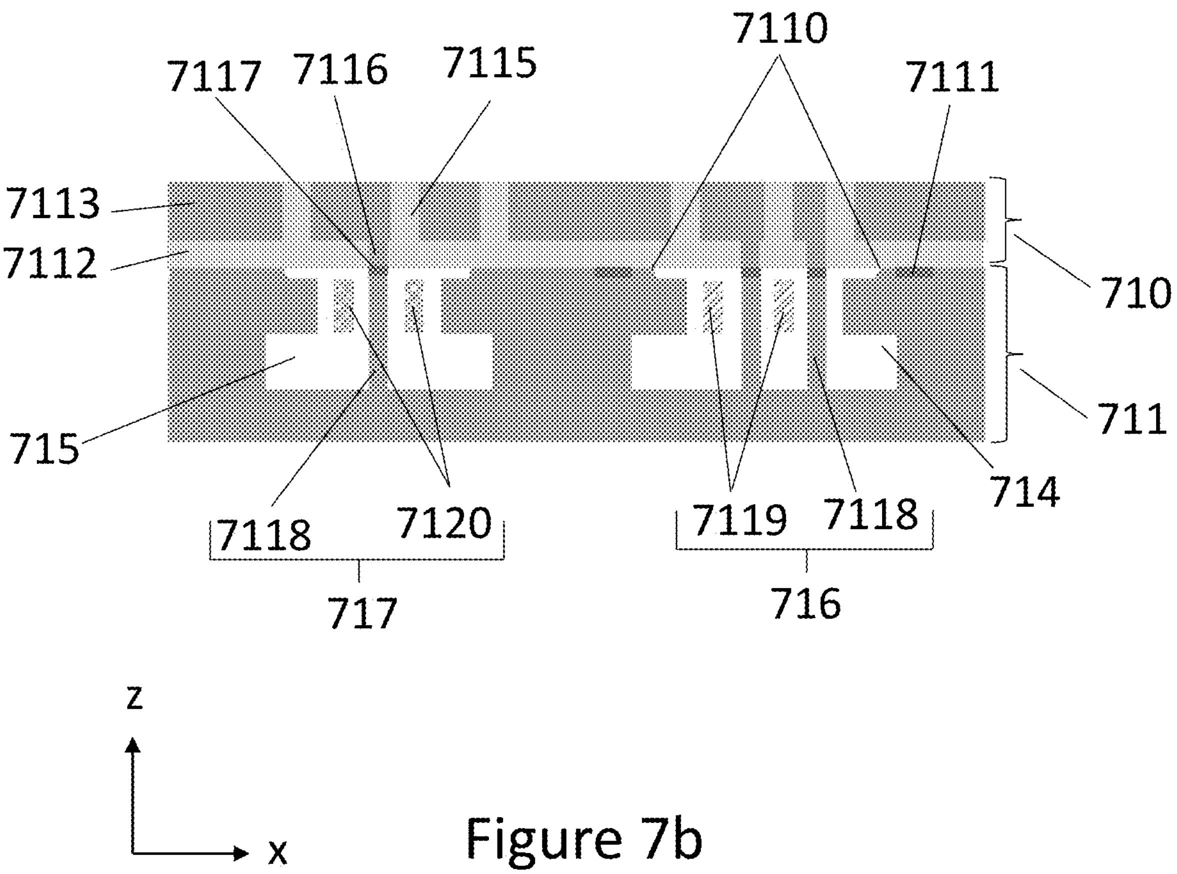

According to an exemplary aspect, the first microelectromechanical device structure may be a gyroscope, and the second microelectromechanical device structure may be an acceleration sensor. FIGS. 7*a*-7*b* illustrate an example of a microelectromechanical component comprising a gyroscope and an acceleration sensor before and after anodic bonding using the method described in this disclosure. FIG. 7*a* illustrates the microelectromechanical component before bonding. The cap wafer 700 is on top of the structure wafer 701 so that the first cap wafer sealing region is aligned with the first structure sealing region along the z-axis, and the second cap wafer sealing region is aligned with the second structure wafer sealing region along the z-axis. The cap wafer 700 comprises a metal layer 7011, a glass region 7012 and a semiconductor region 7013. The metal layer 7011 is formed in the first cap wafer sealing region on the bottom surface of the glass region 7012. The glass region 7012 may extend along the z-axis from the bottom side of the cap wafer to the top side of the cap wafer to separate two or more sections of the semiconductor region from each other forming thereby one or more insulating channels 7015 through the semiconductor region. The semiconductor region 7013 may alternatively or complementarily extend from the top side of the cap wafer to the bottom side of the cap wafer to separate two or more sections of the glass region from each other forming thereby one or more electrically conductive channels 7016 through the glass region. The cap wafer may further comprise additional metal layers 7017 that are connected to the one or more conductive channels 7016 and may act as electrical contacts. The additional metal layers 7017 may be made of a variety of metals such as Al, Cu, Ag, Au, Pt, Pd, Mo or metal alloys. The structure wafer 701 comprises a first cavity 704, a second cavity 705, a first microelectromechanical device structure 706 located in the first cavity 704 and a second microelectromechanical device structure 707 located in the second cavity 705. The first microelectromechanical device structure 706 may comprise fixed semiconductor parts 7018 and a first set of mobile parts 7019 which may form a gyroscope. The second microelectromechanical device structure 707 may comprise fixed semiconductor parts 7018 and a second set of mobile parts 7020 which may form an acceleration sensor. The additional metal layers 7017 can be configured to allow an electrical signal to be transmitted from the MEMS elements to the top surface of the cap wafer or to be transmitted from the top surface of the cap wafer to the MEMS elements. Vertical trenches may be drawn on the top side of the fixed semiconductor parts 7018. Reference numbers 700, 701, 704, 705, 706, 707, 7010, 7011, 7012 and 7013 in FIG. 7*a* correspond to reference numbers 600, 601, 604, 605, 606, 607, 6010, 6011, 6012 and 6013, respectively, in FIG. 6*a*.

FIG. 7*b* illustrates the microelectromechanical component presented in FIG. 7*a* after anodically bonding the gyroscope and the acceleration sensor at different gas pressures. According to an exemplary aspect, the gyroscope may be sealed at a gas pressure close to vacuum level, whereas the acceleration sensor may be sealed in a high-pressure gas.

Reference numbers 710, 711, 714, 715, 716, 717, 7110, 7111, 7112, 7113, 7115, 7116, 7117, 7118, 7119 and 7120 in FIG. 7*b* correspond to reference numbers 700, 701, 704, 705, 706, 707, 7010, 7011, 7012, 7013, 7015, 7016, 7017, 7018, 7019 and 7020, respectively, in FIG. 7*a*.

What is claimed:

1. A method for manufacturing a microelectromechanical component that includes a structure wafer and a cap wafer that defines a horizontal xy-plane and a vertical z-direction that is perpendicular to the xy-plane, the cap wafer including a top surface, a bottom surface that includes glass regions, a first cap wafer sealing region and a second cap wafer sealing region that includes at least one of the glass regions, and the structure wafer includes top and bottom surfaces, and a first cavity and a second cavity, with a first microelectromechanical device structure in the first cavity and a second microelectromechanical device structure in the second cavity, the structure wafer further including a first structure wafer sealing region that surrounds the first cavity and a second structure wafer sealing region that surrounds the first cavity and the second cavity, the method comprising:

forming a metal layer on at least one of the bottom surface of the cap wafer in the first cap wafer sealing region and the top surface of the structure wafer in the first structure wafer sealing region;

placing the cap wafer on top of the structure wafer so that the first cap wafer sealing region is aligned with the first structure wafer sealing region along the z-axis, and the second cap wafer sealing region is aligned with the second structure wafer sealing region along the z-axis;

fixing the cap wafer to the structure wafer in a surrounding first gas atmosphere so that the metal layer and the cap wafer form a hermetically sealing enclosure around outer edges of the first cavity;

changing the surrounding first gas atmosphere to a surrounding second gas atmosphere; and anodically bonding the second cap wafer sealing region to the second structure wafer sealing region in the surrounding second gas atmosphere so that the second cavity is hermetically sealed.

2. The method according to claim 1, further comprising forming trenches in the first structure wafer sealing region of the structure wafer.

3. The method according to claim 1, further comprising forming trenches in the first cap wafer sealing region of the cap wafer.

4. The method according to claim 1, wherein the first microelectromechanical device structure is a gyroscope and the second microelectromechanical device structure is an acceleration sensor.

5. The method according to claim 1, wherein the surrounding first gas atmosphere has a pressure that is different from a pressure of the surrounding second gas atmosphere.

6. The method according to claim 1, wherein the second cap wafer sealing region surrounds the first cap wafer sealing region.

7. The method according to claim 1, wherein the anodically bonding of the second cap wafer sealing region to the second structure wafer sealing region comprises pressing the cap wafer against the structure wafer in an electric field.

8. The method according to claim 1, further comprising forming the metal layer on both of the bottom surface of the cap wafer in the first cap wafer sealing region and the top surface of the structure wafer in the first structure wafer sealing region.

9. The method according to claim 1, wherein the fixing of the cap wafer to the structure wafer comprises sealing inner edges of the metal layer to surround outer edges of the first cavity.

10. The method according to claim 9, wherein the inner edges of the metal layer extend beyond the outer edges of the first cavity.

11. The method according to claim 2, wherein the trenches in the first structure wafer sealing region are formed so that the trenches surround outer edges of the first cavity.

12. The method according to claim 1, further comprising forming a semiconductor region that extends from a top side of the cap wafer to a bottom side of the cap wafer to separate two or more sections of the at least one glass region from each other to form one or more electrically conductive channels through the at least one glass region.

13. A microelectromechanical component comprising:

a cap wafer that defines a horizontal xy-plane and a vertical z-direction that is perpendicular to the xy-plane, the cap wafer including a top surface, a bottom surface that includes glass regions, a first cap wafer sealing region and a second cap wafer sealing region that includes at least one of the glass regions;

a structure wafer including top and bottom surfaces, a first cavity, a second cavity, a first structure wafer sealing region that surrounds the first cavity, and a second structure wafer sealing region that surrounds the first cavity and the second cavity;

a first microelectromechanical device structure in the first cavity;

a second microelectromechanical device structure in the second cavity; and a metal layer on at least one of the bottom surface of the cap wafer in the first cap wafer sealing region and the top surface of the structure wafer in the first structure wafer sealing region;

wherein the first cap wafer sealing region is aligned with the first structure wafer sealing region along the z-axis, and the second cap wafer sealing region is aligned with the second structure wafer sealing region along the z-axis, wherein the metal layer and the cap wafer form a hermetically sealing enclosure around outer edges of the first cavity, and wherein the second cap wafer sealing region is anodically bonded to the second structure wafer sealing region so that the second cavity is hermetically sealed at a different pressure than the first cavity.

14. The microelectromechanical component according to claim 13, further comprising trenches in the first structure wafer sealing region of the structure wafer.

15. The microelectromechanical component according to claim 13, further comprising trenches in the first cap wafer sealing region of the cap wafer.

16. The microelectromechanical component according to claim 13, wherein the first microelectromechanical device structure is a gyroscope and the second microelectromechanical device structure is an acceleration sensor.

17. The microelectromechanical component according to claim 13, wherein the second cap wafer sealing region surrounds the first cap wafer sealing region.

18. The microelectromechanical component according to claim 13, wherein the metal layer is disposed on both of the bottom surface of the cap wafer in the first cap wafer sealing region and the top surface of the structure wafer in the first structure wafer sealing region.

19. The microelectromechanical component according to claim 13, wherein the cap wafer is fixed to the structure wafer such that inner edges of the metal layer are sealed to surround outer edges of the first cavity.

20. The microelectromechanical component according to claim 13, further comprising a semiconductor region that extends from a top side of the cap wafer to a bottom side of the cap wafer to separate two or more sections of the at least one glass region from each other to form one or more electrically conductive channels through the at least one glass region.

* * * * *